United States Patent [19]

Bosler et al.

[11] 4,298,905
[45] Nov. 3, 1981

[54] COOLING APPARATUS FOR ELECTRONIC MODULES

[75] Inventors: Alan J. Bosler, Bedford; Larry E. Nash, Washington, both of Ind.

[73] Assignee: The United States of America as represented by the Secretary of the Navy, Washington, D.C.

[21] Appl. No.: 122,388

[22] Filed: Feb. 19, 1980

[51] Int. Cl.³ .............................................. H05K 7/20
[52] U.S. Cl. .................................... 361/386; 361/393; 361/388; 361/385
[58] Field of Search ............... 361/381, 382, 385, 386, 361/415, 388, 391, 393, 394; 174/15 R; 165/80 A, 80 B, 80 C, 157, 185

[56] References Cited

U.S. PATENT DOCUMENTS

| 3,243,660 | 3/1966 | Yuska | 361/388 |
| 3,946,276 | 3/1976 | Braun | 361/386 |
| 4,184,539 | 1/1980 | Rein | 361/386 |
| 4,235,283 | 11/1980 | Gapta | 361/386 |

*Primary Examiner*—Gerald P. Tolin

[57] ABSTRACT

A plurality of electronic modules are mounted in a housing having conduits for carrying coolant. Each electronic module is mounted in channel grooves in a pair of side plates and springs are provided in each groove for upwardly biasing each module. A top cold plate is forced downwardly by a screw-operated wedge plate and the cold plate engages a metal frame on each electronic module. The springs in the channel grooves are compressed and apply a force which insures good contact between the cold plate and each frame of each module thereby facilitating transfer of heat away from each electronic module.

8 Claims, 3 Drawing Figures

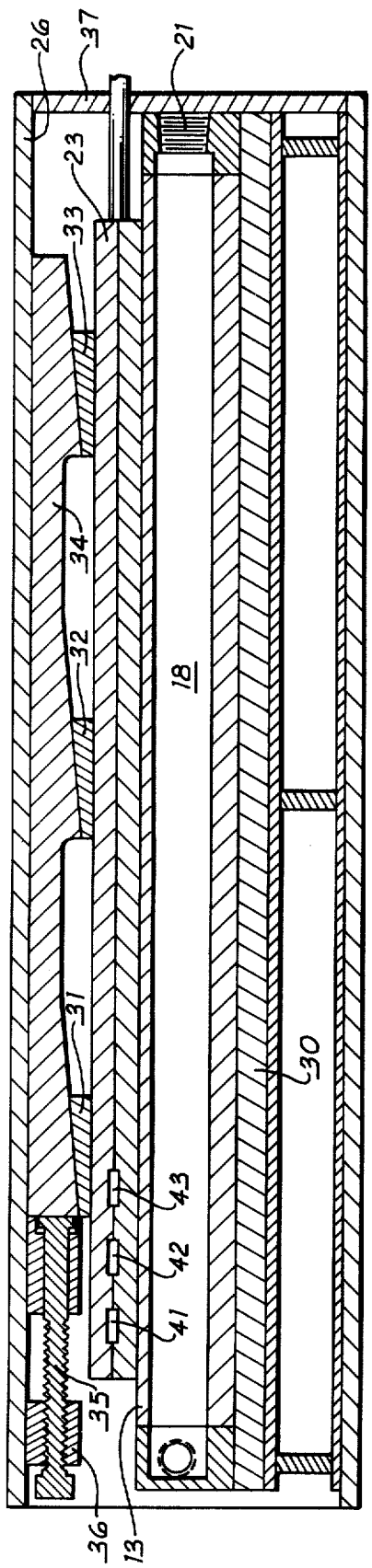
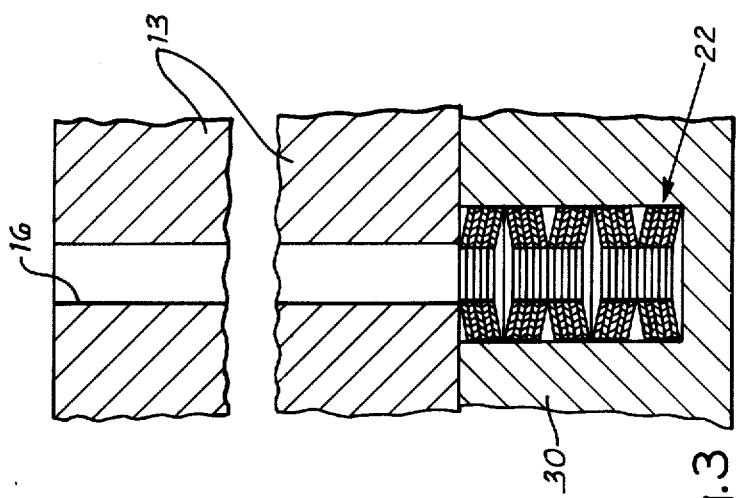
Fig.2
Fig.3

COOLING APPARATUS FOR ELECTRONIC MODULES

BACKGROUND OF THE INVENTION

The present invention relates to an improved cooling arrangement for standard electronic modules which are slidably mounted in grooves or ways in a chassis.

There is a constant demand for smaller electrical and electronic components, particularly in the aircraft and missile fields, as weight is of extreme importance. One concept of microelectronics which has been recently developed and which offers a great reduction in size and weight of electronic units is that of integrated circuitry which is formed on insulated bases such as glass, fused silica, or ceramic substrates. Integrated circuitry includes a number of active and passive components which are fabricated by one or more of a combination of several thin film deposition techniques onto a glass or ceramic substrate.

In order to reduce costs, expedite production, and provide a reliable electronic component, the Department of the Navy, as well as other military branches, have been engaged in a standard hardware program in which electronic plug-in modules have been developed which are capable of meeting various system requirements. One such plug-in module is shown in U.S. Pat. No. 3,243,660, entitled "Electronic Module Assembly", which issued Mar. 29, 1966, to Leonard J. Yuska and David P. Zimmerman.

One concept of a standard hardware program is to have a plurality of modules which plug in a chassis to form an assembly and normally these plug-in modules slide in grooves or ways in the chassis and engage a mating female connector. These modules are closely assembled and dissipate a lot of heat which, if not removed, greatly affects component reliability.

Various attempts have been made to cool electronic assemblies and generally employ some type of cooling coil and fan assembly. One such device is shown in U.S. Pat. No. 2,187,011, entitled, "Cooling Means For An Electrical Apparatus", which issued Jan. 16, 1940, to Paul F. Braden. In one embodiment of this patent, a fan blows air over a cooling coil and the air passes successively through three shelves which support vacuum tubes and other electrical components. The disadvantage of such an arrangement, however, is that the first shelf receives cool air, which is heated by the electrical components, and the last shelf receives hot air and experiences little or no cooling effect.

In U.S. Pat. No. 3,942,586, entitled, "Cooling Arrangement For Flat Semiconductor Components", which issued Mar. 9, 1976, to Paul Fries, the inventor recognized a need for cooling all the mounted components. He stated that there is a need for an improved cooling arrangement for stacked flat semiconductors which can: (1) take advantage of the benefits of the heat pipe; and (2) in addition, provide adequate cooling to the semiconductors no matter what their location is within the column or stack. That is, the problem is to provide an arrangement in which cooling air of essentially the same temperature can flow over all the heat pipes in such an arrangement. The solution proposed was to axially align the semiconductor components with the axes of the heat pipes of the cooling elements which are located one over the other, arranged so that they are rotationally displaced with respect to each other about the stack axis.

In U.S. Pat. No. 4,120,021, entitled, "Cooling System For Electronic Assembly", which issued Oct. 10, 1978, to Maurice Roush, there is described a system which provides a more efficient and higher capacity heat transfer from the circuit modules to the refrigeration system. There is provided a plurality of cooling bars associated with the chassis of the electronic apparatus and the cooling bars have a plurality of slots formed therein. The cooling bars are positioned adjacent one another and spaced apart a distance according to the width of the circuit modules. The circuit modules are provided with heat conducting flanges along the sides thereof which are adapted for fitting into the slots of adjacent cooling bars in heat conducting relation therewith. Clamping means are provided to clamp the flanges into tighter heat conducting contact with the slots. In a preferred embodiment, the clamping means comprises a plurality of camming surfaces attached to the face of the cooling bar adjacent the slots, and wedge blocks having second camming surfaces slidably positioned on the first camming surfaces adjacent the slots. Means are provided for moving the wedge blocks along the camming surfaces thereby forcing the wedge blocks against the heat conducting flanges and the flanges against the sides of the slots for maximum heat conducting contact.

SUMMARY OF THE INVENTION

The present invention provides an improved cooling arrangement for a standard electronic plug-in module assembly having a plurality of standard modules supported in grooves in parallel side plates. Each modules has a metallic heat plate which facilitates the transfer of heat from the electronic components to the parallel metallic sides which support the modules. A spring is provided in each groove in the side plates for upwardly biasing each module. A top cold plate is forced downwardly by a screw-operated wedge plate and this cold plate engages a metal frame on each electronic module. The springs in the grooves are compressed and apply a force which insures good contact between the cold plate and each frame of each module thereby facilitating transfer of heat away from each electronic module. The top plate is provided with passages for carrying a cooling liquid for removing heat transferred from the modules to the top plate.

It is therefore a general object of the present invention to provide an improved cooling arrangement for an electronic plug-in module assembly.

Another object of the present invention is to provide a mechanical arrangement to facilitate the removal of heat from an electronic module by conduction.

Other objects and advantages of the present invention will be readily appreciated as the same becomes better understood by reference to the following detailed description when considered in connection with the accompanying drawings.

BRIEF DESCRIPTION OF THE DRAWINGS

FIG. 2 is a longitudinal sectional view taken on line 2—2 of FIG. 1; and

FIG. 3 is a partial sectional view showing a spring arrangement for biasing plug-in modules.

DESCRIPTION OF THE PREFERRED EMBODIMENT

Figure 1:
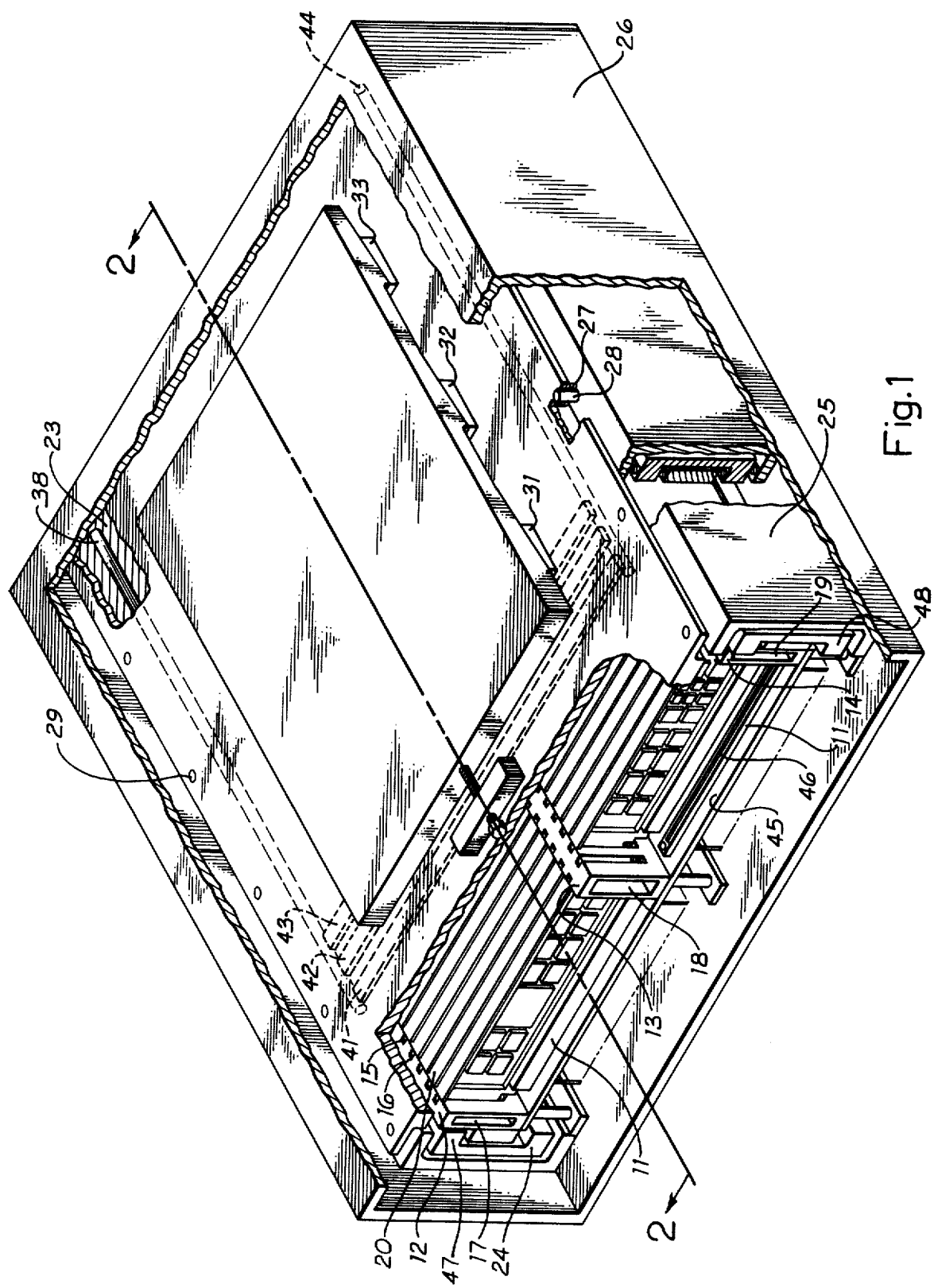
FIG. 1 is a view, partly broken away, showing a preferred embodiment of the invention.

Referring now to the drawings, and particularly to FIG. 1, there is shown a plurality of plug-in modules 11 which are arranged in two rows. Each module 11 is supported in grooves in two parallel side plates. One row of modules is supported by side plates 12 and 13 and the second row of modules is supported by side plates 13 and 14. By way of example, plug-in modules 11 might be of the type disclosed in U.S. Pat. No. 3,243,660, entitled "Electronic Module Assembly", which issued Mar. 29, 1966, to Leonard J. Yuska and David P. Zimmerman. Each module is comprised of a frame 20 which is a sheet metal piece with a bent over lip at the top in the shape of an inverted "L" or a "T". A connector, which by way of example might have either 40 or 100 pins arranged in two parallel rows, is attached to the frame, as by bonding. A flange 15 is provided on each end of the frame and flange 15 is adaptable for sliding in a groove 16 whereby the side plates support the plugged-in module.

Side plates 12, 13, and 14, which are made of a good heat conducting material, such as copper, have passageways, 17, 18, and 19, respectively, which carry a cooling liquid. By way of example, the cooling liquid might enter through a rear opening 21 in center passageway 18 and flow forward and then divide and flow from front to rear through passageways 17 and 19.

As best shown in FIG. 3 of the drawings, a spring assembly 22 is provided at the bottom of each groove 16 and, when modules 11 are in place, these spring assemblies support flanges 15. Spring assemblies 22 are comprised of a plurality of belleville spring washers which might be stacked in series and in parallel. Stacking the washers in series increases the deflection in proportion to the number of washers and, in order to increase the load, the washers may be stacked in parallel. In the embodiment shown in FIG. 3 of the drawing, there are five groups of washers mounted in series and each group is comprised of five washers in parallel, thereby making a total of twenty-five washers for each spring assembly 22.

Referring now to FIGS. 1 and 2 of the drawings, a top cold plate 23 is supported by rails 24 and 25 which are stationarily attached inside case 26. A plurality of springs 27 are positioned about pins 28 which are attached to rails 24 and 25 and pins 28 pass through holes 29 in cold plate 23. This arrangement permits cold plate 23 to be raised and lowered with respect to modules 11. Three wedge plates 31, 32, and 33 are attached to the top side of cold plate 23 and are engaged by complementary wedge surfaces on wedge plate 34. A jackscrew 35 is threadedly engaged with a bar 36 which is attached to the top of case 26 and rotation of jackscrew 35 moves wedge plate 34. When wedge plate 34 moves toward the back end 37 of case 26, wedge surfaces on wedge plate 34, which are in engagement with wedge plates 31, 32, and 33, depress cold plate 23 downwardly and cold plate 23, in turn, engages and depresses each plug-in module 11. Downward movement of each plug-in module 11 causes spring assemblies 22 to be depressed and these spring assemblies apply an upward force to keep the frame 20 of each plug-in module in contact with cold plates 23. Each module 11 acts independently thereby permitting good contact with cold plate 23 regardless of module tolerances. Cold plate 23 is provided with passageways that carry cooling liquid for removing heat which is transferred from modules 11. Cooling liquid enters at the rear end of plate 23 and flows in a forward direction through passageway 38. Then cooling liquid flows through passageways 41, 42, and 43 to passageway 44 and then to the rear and out of cold plate 23.

OPERATION

Plate 45, which holds a plurality of female connectors 46 into which modules 11 can be plugged, is attached to slidable side rails 47 and 48, and plate 45 can be withdrawn from case 26 to facilitate mounting modules 11. When plate 45 and modules 11 are within case 26, as shown in FIG. 1 of the drawings, jackscrew 35 is rotated in a direction to move wedge plate 34 toward back end 37 of case 26. The three wedge surfaces on plate 34 engage wedge plates 31, 32, and 33 on cold plate 23, and movement of plate 34 depresses cold plate 23. Cold plate 23 engages the top of each frame 20 of modules 11 and forces modules 11 downwardly thereby compressing spring assemblies 22 which support modules 11. Spring assemblies 22 apply a biasing force which hold frames 20 in intimate contact with cold plate 23. When modules 11 are in operation, cooling liquid is pumped through sides plates 12, 13 and 14, and also through cold plate 23 to facilitate removal of heat from inside case 26.

When it is desired to remove modules 11 from case 26, jackscrew 35 is turned in a direction which moves wedge plate 34 away from back end 37 of case 26, thereby removing the force which biases cold plate 23 against frames 20 of modules 11. Springs 27 then raise cold plate 23 a sufficient distance so that frames 20 no longer contact cold plate 23 and modules 11 can be withdrawn from case 26.

It can thus be seen that a novel arrangement is made for facilitating removal of heat from an electronic module assembly by providing both side and top cooling modes. The arrangement allows for quick removal of the module assembly from its protective case and each module in the assembly is acted upon individually thereby allowing intimate contact between each module and a cold top plate regardless of modules tolerances.

Obviously many modifications and variations of the present invention are possible in the light of the above teachings. It is therefore to be understood that the invention may be practiced otherwise than as specifically described.

We claim:

1. A modular electronic system comprising,
   a case having a top, bottom and a plurality of sides,
   a support assembly slidably mounted in said case and having at least two side plates, each having a plurality of spaced grooves therein,
   spring means in each said groove,
   a plurality of electronic modules each having a metallic frame with the ends of each said metallic frame being slidably mounted in opposed grooves in said side plates and supported by said spring means,
   a metallic top plate positioned between said top of said case and said metallic frames of said electronic module,
   means for moving said top plate into engagement with each frame of each electronic module whereby said spring means are depressed and provide a biasing force to engage said frames with said metallic top plate, and
   means for cooling said side plates and said metallic top plate.

2. A modular electronic system as set forth in claim 1 wherein said top plate is supported by springs on said side plates.

3. A modular electronic system as set forth in claim 1 wherein said means for moving said top plate includes at least one wedge surface on said top plate and a screw-operated plate having a complementary wedge surface in engagement with said at least one wedge surface on said side plates.

4. A modular electronic system as set forth in claim 1 wherein said spring means in each said groove comprises a plurality of parallel stacks of belleville washers stacked in series.

5. A modulator electronic system as set forth in claim 1 wherein said means for cooling said top plate comprises passages in said top plate and means for circulating cooling liquid through said passages.

6. A modular electronic system comprising, a case having a top, bottom and a plurality of sides, a support assembly slidably mounted in said case and having at least two side plates, each having a plurality of spaced grooves therein, a plurality of belleville washers in each said groove, said belleville washers being arranged in parallel stacks and stacked in series, a plurality of electronic modules each having a metallic frame with the ends of each said metallic frame being slidably mounted in opposed grooves in said side plates and supported by said belleville washers, a metallic top plate positioned between said top of said case and said metallic frames of said electronic modules, said metallic top plate having at least one wedge surface thereon, a screw-operated wedge plate having a complementary wedge surface in engagement with said wedge surface on said metallic top plate, and means for cooling said side plates and said metallic top plate.

7. A modular electronic system as set forth in claim 6 wherein said top plate is supported by springs on said side plates.

8. A modulator electronic system as set forth in claim 6 wherein said means for cooling said top plate comprises passages in said top plate and means for circulating cooling liquid through said passages.

* * * * *